US010062612B2

(12) United States Patent
Brunco et al.

(10) Patent No.: US 10,062,612 B2
(45) Date of Patent: Aug. 28, 2018

(54) METHOD AND SYSTEM FOR CONSTRUCTING FINFET DEVICES HAVING A SUPER STEEP RETROGRADE WELL

(71) Applicant: GLOBALFOUNDRIES INC., Grand Cayman (KY)

(72) Inventors: David Paul Brunco, Malta, NY (US); Daniel Jaeger, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/288,503

(22) Filed: Oct. 7, 2016

(65) Prior Publication Data

US 2018/0102291 A1    Apr. 12, 2018

(51) Int. Cl.
*H01L 21/8234* (2006.01)
*H01L 27/088* (2006.01)
*H01L 21/02* (2006.01)

(52) U.S. Cl.
CPC ........ *H01L 21/823431* (2013.01); *H01L 21/02129* (2013.01); *H01L 21/823481* (2013.01); *H01L 27/0886* (2013.01)

(58) Field of Classification Search
CPC ....... H01L 29/66795; H01L 21/823821; H01L 27/0924; H01L 21/823431
See application file for complete search history.

(56) References Cited

U.S. PATENT DOCUMENTS

2013/0258330 A1\* 10/2013 Maekawa .............. G01N 21/93
356/237.4
2015/0243739 A1\* 8/2015 Chen .................. H01L 29/7851
257/623

\* cited by examiner

*Primary Examiner* — Selim Ahmed
*Assistant Examiner* — Evan Clinton
(74) *Attorney, Agent, or Firm* — Williams Morgan, P.C.

(57) ABSTRACT

Generally, the present disclosure is directed to a method for forming a FinFET device that may be used in designs that include both tight and relaxed fin pitches. The method for forming the fins includes: forming a first layer of doped silicate glass above a semiconductor wafer and within a plurality of recesses located adjacent the fins; forming a first layer of nitride above the first doped silicate glass layer; and forming a conformal oxide layer above the first nitride layer, substantially filling relatively narrow recesses between fins having a tight pitch and lining relatively wide recesses between fins having a relaxed pitch.

19 Claims, 10 Drawing Sheets

METHOD AND SYSTEM FOR CONSTRUCTING FINFET DEVICES HAVING A SUPER STEEP RETROGRADE WELL

BACKGROUND OF THE INVENTION

Field of the Invention

Generally, the present disclosure relates to the manufacture of sophisticated semiconductor devices, and, more specifically, to various methods and FINFET devices having super steep retrograde wells.

Description of the Related Art

The technology explosion in the manufacturing industry has resulted in many new and innovative manufacturing processes. Today's manufacturing processes, particularly semiconductor manufacturing processes, call for a large number of significant steps. These process steps usually require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot, using semiconductor-manufacturing tools, such as an exposure tool or a stepper. As an example, an etch process may be performed on the semiconductor wafers to shape objects on the semiconductor wafer, such as polysilicon lines, each of which may function as a gate electrode for a transistor. As another example, a plurality of metal lines, e.g., aluminum or copper, may be formed that serve as conductive lines that connect one region on the semiconductor wafer to another. In this manner, integrated circuit chips may be fabricated.

These steps may be employed to design transistors, such as metal oxide field effect transistors (MOSFETs or FETs). A FET is a device that typically includes a source region, a drain region, a channel region that is positioned between the source region and the drain region, and a gate electrode positioned above the channel region. Current flowing through the FET is controlled by controlling the voltage applied to the gate electrode. If a voltage that is less than the threshold voltage of the device is applied to the gate electrode, then there is no current flowing through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this reduced spacing between the source and the drain makes it difficult to efficiently inhibit the electrical potential of the channel from being adversely affected by the electrical potential of the drain. This is sometimes referred to as a so-called short channel effect, wherein the characteristic of the FET as an active switch is degraded.

There are essentially two types of FETs: planar FETs and so-called 3D devices, such as an illustrative finFET device, which is a 3-dimensional structure. More specifically, in a finFET, a generally vertically positioned, fin-shaped active area is formed and a gate electrode encloses both of the sides and the upper surface of the fin-shaped active area to form a trigate structure so as to use a channel having a 3-dimensional structure instead of a planar structure. In some cases, an insulating cap layer, e.g., silicon nitride, is positioned at the top of the fin and the finFET device only has a dual-gate structure.

FinFET designs use "fins" that may be formed on the surface of a semiconductor wafer using selective-etching processes. The fins may be used to form a raised channel between the gate and the source and drain of a transistor. The gate is then deposited such that it wraps around the fin to form a trigate structure. Since the channel is extremely thin, the gate would generally have a greater control over the carriers within. However, when the transistor is switched on, the shape of the channel may limit the current flow. Therefore, multiple fins may be used in parallel to provide greater current flow for increased drive strength.

FIG. 1 illustrates a stylized depiction of a conventional finFET device. A finFET device 100 illustrated in FIG. 1 comprises a plurality of "fins" 110. The semiconductor device may be positioned in a vertical orientation, creating one or more fins 110. The source and drain of the finFET are placed horizontally along the fin. A high-k metal gate 120 wraps over the fin, covering it on three sides. The gate 120 defines the length of the finFET device. The current flow occurs along an orthogonal crystal plane in a direction parallel to the plane of the semiconductor wafer. The electrically significant height of the fin (labeled H) is typically determined by the amount of oxide recess in the fin reveal step and hence is substantially similar for all of the fins 110.

The thickness of the fin (labeled $T_{fi}$) determines the short channel behavior of the transistor device and is usually small in comparison with the height H of the fin 110. The pitch (labeled P) of the fins is determined by lithographic constraints and dictates the wafer area to implement the desired device width. A small value of the pitch P and a large value of the height H enable a desirable packing of the devices per square area resulting in a denser design, or more efficient use of silicon wafer area.

In some applications, it has proven difficult to achieve a relatively small pitch. The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later. Generally, the present disclosure is directed to a method for forming a finFET device. The method includes: forming a plurality of recesses in a semiconductor wafer to form a plurality of fins therebetween, a first portion of the recesses being relatively narrower than a second portion of the recesses; forming a layer of first doped silicate glass above the semiconductor wafer and within the plurality of recesses; forming a first layer of nitride above the first doped silicate glass layer; forming a conformal oxide layer above the first nitride layer, substantially filling the first portion of relatively narrower recesses and lining the second portion of recesses; removing the conformal oxide layer from a top surface of the plurality of the fins; removing the first doped silicate glass layer, the first nitride layer, and the conformal oxide layer adjacent a first portion of the plurality of fins and recesses; forming a layer of second doped silicate glass having an opposite doping polarity to the first doped silicate glass above the wafer; removing the second doped silicate glass layer and at least a portion of the conformal oxide layer from above the first doped silicate glass layer; forming a second layer of nitride above the semiconductor wafer; performing a shallow trench isolation process to at least partially fill the plurality of recesses; and removing a portion of the material in the plurality of recesses to reveal the plurality of fins. Alternatively, the present disclosure is directed to a method for forming a finFET device. The method includes: forming a plurality of recesses in a semiconductor wafer to form a plurality of fins therebetween; forming a first layer of doped silicate glass above the semiconductor wafer and within the plurality of recesses; forming a first layer of nitride above the first doped silicate glass layer; forming an oxide layer above the nitride layer, substantially filling a first portion of the plurality of recesses and forming a layer of oxide on sidewall and bottom surfaces of a second portion of the recesses; removing the oxide layer from a top surface of the plurality of the fins and the bottom surface of the second portion of the recesses; forming a first mask over a portion of the plurality of fins and recesses; removing the first doped silicate glass layer, the nitride layer, and the oxide layer from the plurality of fins and recesses free of the first mask; removing the first mask; forming a second layer of doped silicate glass above the wafer; forming a second mask above at least a portion of the plurality of fins and recesses free from the first doped silicate glass layer; removing the second doped silicate glass layer and at least a portion of the oxide layer from the plurality of fins and recesses free of the second mask; removing the second mask; forming a second layer of nitride above the semiconductor wafer; performing a shallow trench isolation process to at least partially fill the plurality of recesses; and removing a portion of the material in the plurality of recesses to reveal the plurality of fins.

BRIEF DESCRIPTION OF THE DRAWINGS

The disclosure may be understood by reference to the following description taken in conjunction with the accompanying drawings, in which like reference numerals identify like elements, and in which.

Figure 1:
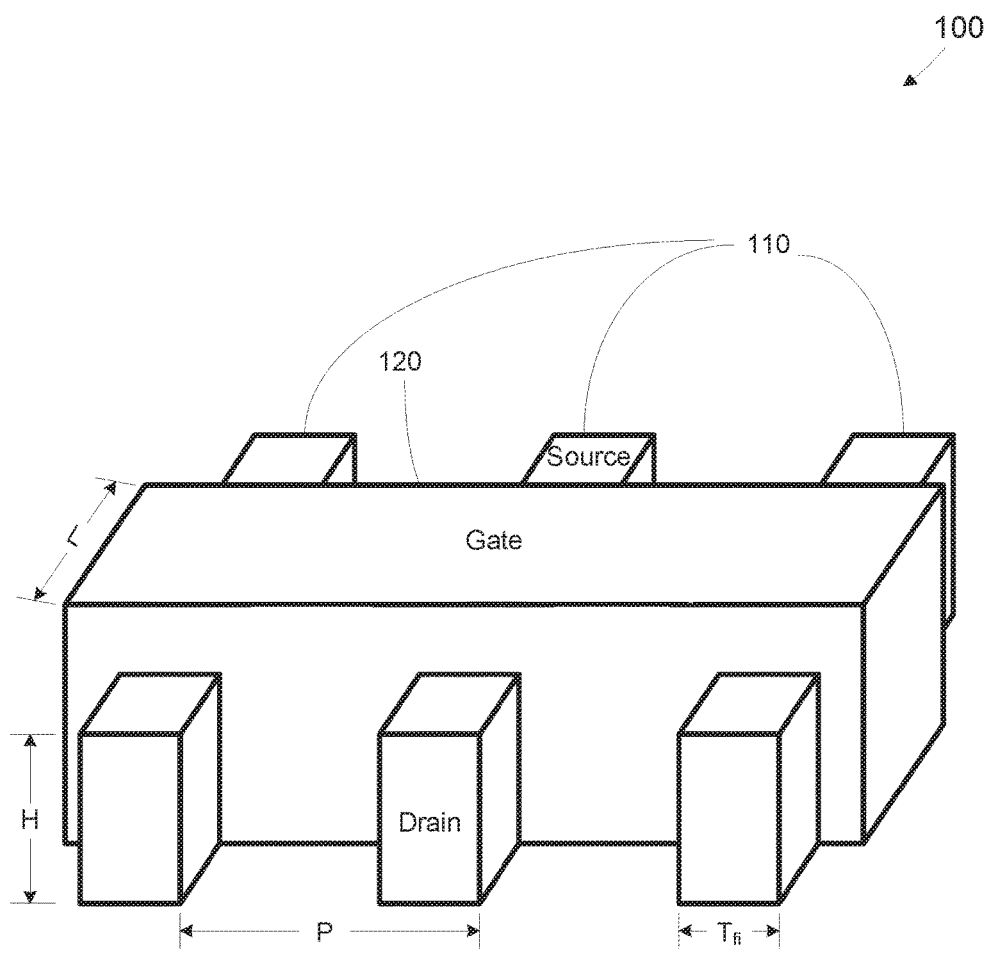
FIG. 1 illustrates a depiction of a conventional finFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein are directed to semiconductor devices (e.g., finFET transistors) having substantially steep retrograde wells with both relaxed and tight fin pitches. The smallest distance between fins is one of the key defining dimensions of a semiconductor manufacturing technology node. Electrical circuits typically involve finFETs spaced at this smallest pitch, often referred to as tight or narrow pitch, and finFETs separated by larger distances, often referred to as relaxed or wide pitch. For example, the tight fin pitch for the 14 nm technology node is approximately 45 nm, while relaxed pitch finFETs are typically separated by 60 nm or more. For the 7 nm technology, the tight fin pitch is approximately 30 nm while relaxed fin pitch devices are separated by approximately 40 nm or more. The steep retrograde wells of embodiments herein may provide for forming a finFET device that advantageously has fins with a tight and/or relaxed fin pitch having a lowly doped channel above either a p-type doped region, or an n-type doped region, or both.

Figure 2:
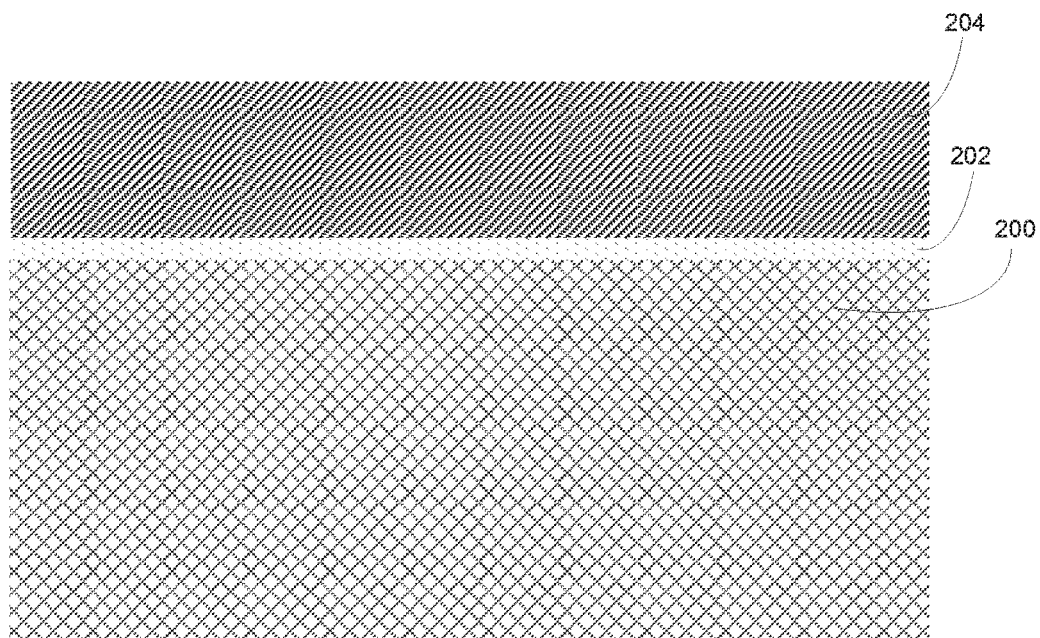
FIGS. 2-15 illustrate a stylized depiction of a series of process steps that are utilized to produce a first embodiment of a finFET device having regions that include both tight and relaxed fin pitches.

FIGS. 2-15 illustrate a structure and a methodology for forming the structure that includes finFET transistors with fins that are formed in an nMOS region or fins that are formed in a pMOS region of a wafer. The process begins in FIG. 2 where a Si wafer 200 is shown.

A silicon dioxide layer, typically called a pad oxide, 202 has been grown over the wafer 200 using any of a variety of techniques. Those skilled in the art will appreciate that the thickness of the pad oxide layer 202 may vary substantially without departing from the spirit of scope of the instant invention. For example, it is envisioned that the thickness of the pad oxide layer 202 may vary in the range of about 1 to about 10 nm, with a preferred range of about 2 nm to about 5 nm.

A silicon nitride layer, typically called a pad nitride, 204 is deposited over the oxide layer 202. Those skilled in the art will appreciate that the thickness of the pad nitride layer 204 may vary substantially without departing from the spirit of scope of the instant invention. For example, it is envisioned that the thickness of the pad nitride layer 204 may vary in the range of about 5 to about 100 nm, with a preferred range of about 10 nm to about 50 nm.

Figure 3:
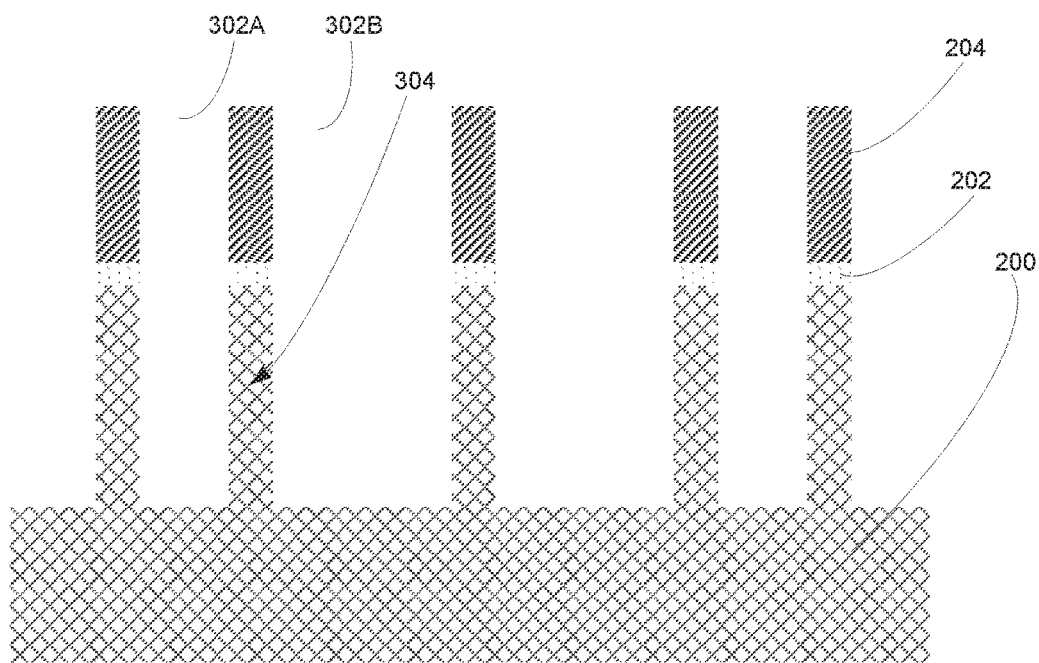

At this point in the process, any of a variety of conventional patterning and etching schemes known to those skilled in the art having benefit of the present disclosure can be used to remove portions of the pad oxide layer 202 and the pad nitride layer 204, as well as the underlying wafer 200 to produce the pattern generally illustrated in FIG. 3. Conventional patterning and etching processes known to those skilled in the art having benefit of the present disclosure are used to form a series of recesses 302A, 302B. The patterning techniques may, for example, include self-aligned double and quadruple patterning methods, cut masks to remove unwanted fins, and lithography techniques using immersion techniques, extreme ultraviolet (UV) or e-beam processes. The fin etch process would preferably achieve comparable etch depths; however, the distance between fins may be varied to produce both tight and relaxed fin pitches, with the recesses 302A being substantially narrower than the recesses 302B to produce fins 304 of substantially similar width, but with varied pitches, as illustrated. Often nearest fins of the same device type, e.g. nMOS fin to nMOS fin, will be with tight pitch whereas nearest fins of different device types, e.g. nMOS fin to pMOS fin, will be at a relaxed pitch to allow for electrical isolation between different type fins.

In one embodiment, the fin etch process may be performed using a conventional dry etch process, such as a reactive-ion etching (RIE) process. In one embodiment, the dry etch processes are followed with one or more wet etch processes, such as ammonium hydroxide and hydrogen peroxide mixtures (APM) and hydrofluoric acid (HF) to remove material and/or remove unwanted residues.

Figure 4:
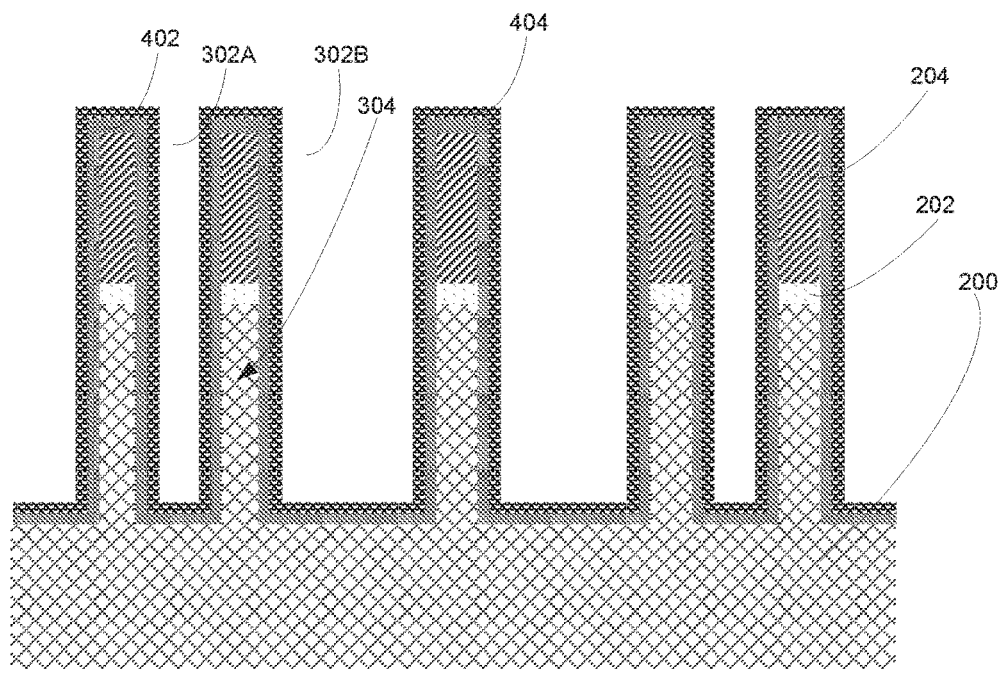

Turning now to FIG. 4, after the etching process has been completed, a conformal borosilicate glass (BSG) layer 402 may be deposited, followed by a first nitride layer 404. In one embodiment, the conformal BSG layer 402 may be deposited by Atomic Layer Deposition (ALD). Those skilled in the art will appreciate that the thickness of the BSG layer 402 may vary substantially without departing from the spirit of scope of the instant invention. For example, it is envisioned that the thickness of the BSG layer 402 may vary in the range of about 0.5 to about 6 nm, with a preferred range of about 1 nm to about 4 nm. Those skilled in the art will appreciate that the thickness of the first nitride layer 404 may vary substantially without departing from the spirit of scope of the instant invention. For example, it is envisioned that the thickness of the first nitride layer 404 may vary in the range of about 1 to about 6 nm, with a preferred range of about 1.5 nm to about 4 nm. In some embodiments, it may be useful to include an optional shallow trench isolation (STI) liner oxide (not shown) prior to depositing the BSG layer 402.

Figure 5:
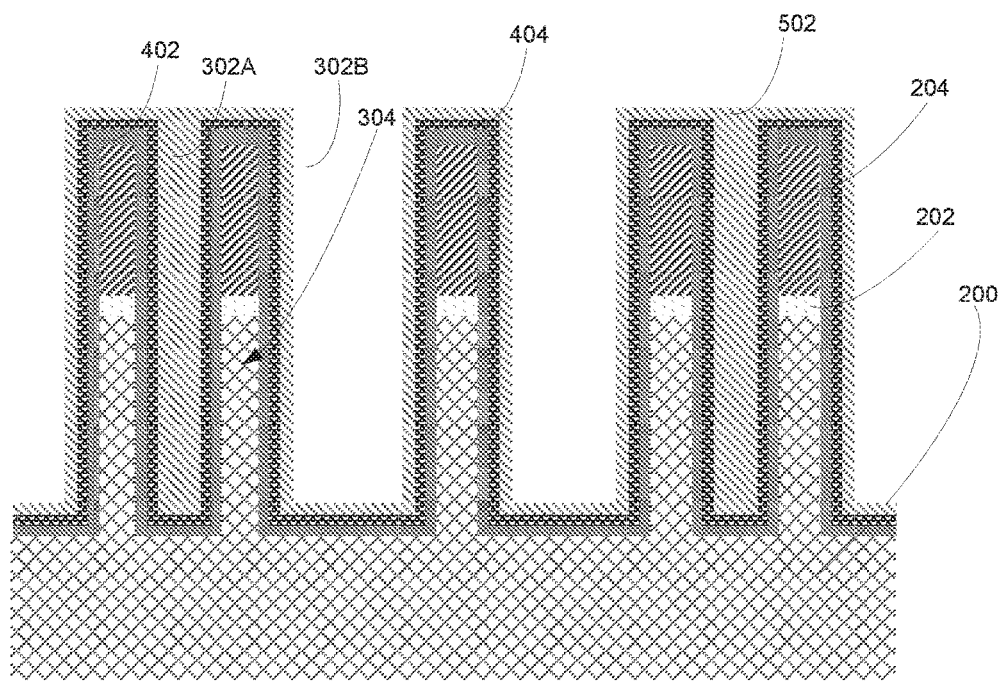

As shown in FIG. 5, a conformal oxide layer 502 is deposited over the first nitride layer 404. In one embodiment, the conformal oxide layer 502 is constructed using an atomic layer deposition (ALD) technique. Those skilled in the art will appreciate that the thickness of the conformal oxide layer 502 may vary substantially without departing from the spirit of scope of the instant invention. For example, it is envisioned that the thickness of the conformal oxide layer 502 may vary in the range of about 2 nm to about 15 nm, with a preferred range of about 4 nm to about 10 nm. Those skilled in the art will appreciate that, owing to the difference in the widths of the recesses 302A, 302B, the conformal oxide layer 502 thickness is chosen to substantially fill the narrower recesses 302A, but not the relatively wider recesses 302B.

Figure 6:
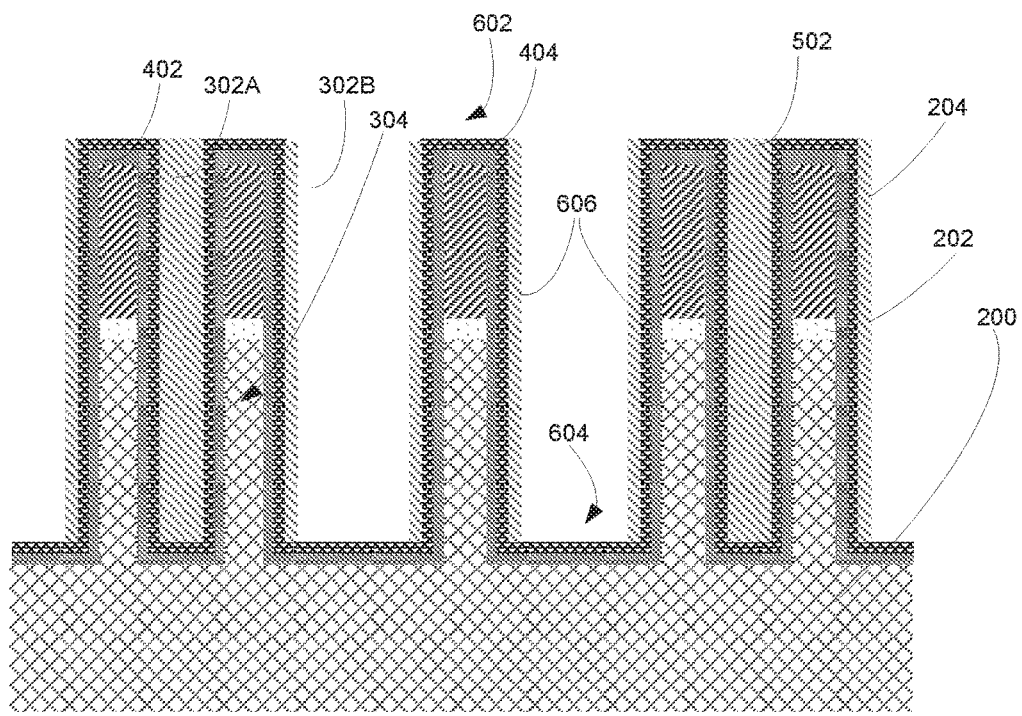

FIG. 6 illustrates the result of a subsequent anisotropic etch that has been configured to etch the conformal oxide layer 502 and stop upon detecting nitride present in the first nitride layer 404. As a result, the conformal oxide layer 502 is substantially removed from a region 602 adjacent the top of the fins 304 and a region 604 adjacent the bottom of the recesses 302B, but a substantial portion of the conformal oxide layer 502 remains in place on the sidewalls 606 in both the narrower and relatively wider recesses 302A, 302B. Thus, the narrower recesses 302A remain substantially filled by the conformal oxide layer 502 whereas the wider recesses 302B only have the conformal oxide layer 502 lining the sides.

Figure 7:
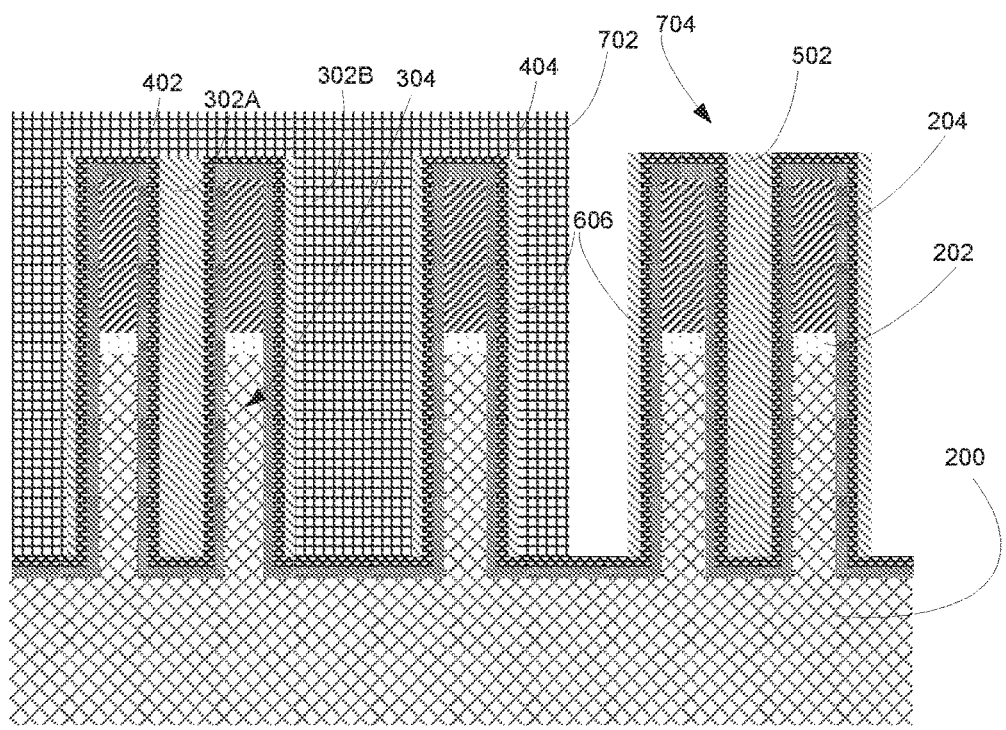

Turning now to FIG. 7, a lithographic process is illustrated to protect the BSG layer 402 in selected regions and allow removal of the BSG layer 402 in other regions. Those skilled in the art will appreciate that in at least some of these other regions in which the BSG layer 402 has been removed, a phosphosilicate glass (PSG) layer will subsequently be introduced (see, for example, FIGS. 9-14) to produce both p-well regions (where BSG remains) and n-well regions (where PSG remains) on the wafer 200.

Using conventional techniques, a mask 702 is formed over select regions of the wafer 200, leaving the region 704 exposed for subsequent etching steps. In some embodiments, it may be useful to utilize a planarizing layer and/or bottom antireflection coating (BARC), as is known by those skilled in the art. Regions covered by the mask 702 will preserve the BSG layer 402 and be utilized for nMOS devices in some embodiments. Exposed regions 704 will subsequently have the BSG removed and a PSG layer introduced and be utilized for pMOS devices in some embodiments.

Figure 8:
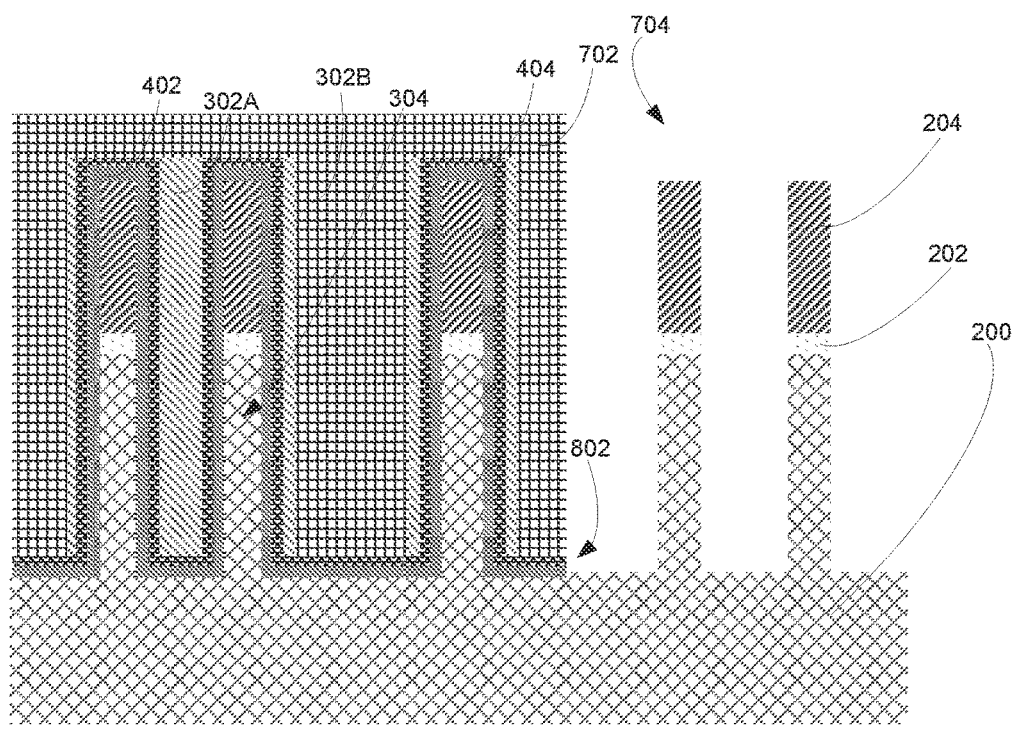

Turning now to FIG. 8, the wafer 200 has been exposed to a conventional etch process that has removed substantially all of the conformal oxide layer 502, the first nitride layer 404, and the BSG layer 402 from the regions of the wafer not protected by the mask 702. In some embodiments, the etch process may lead to lateral etching that extends under the mask 702 in a region 802. Thus, in instances where lateral etching proves to be problematic, it may be useful to increase the width of the mask 702 to compensate for the magnitude of the lateral etch.

Figure 9:
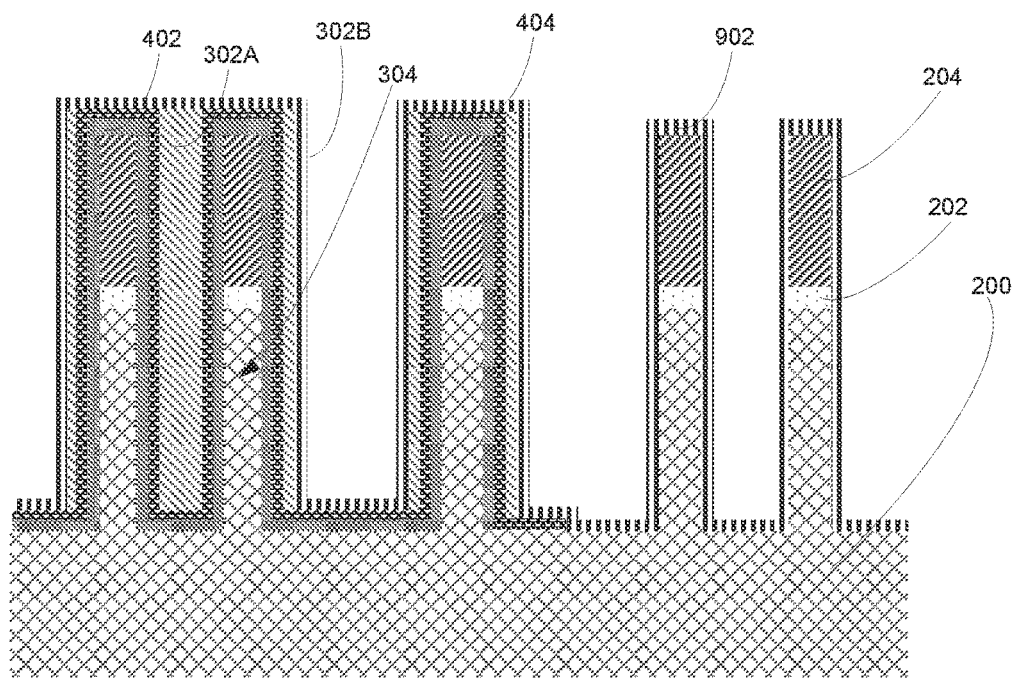

Thereafter, as shown in FIG. 9, the mask 702 may be removed using conventional techniques, and then a conformal layer of phosphosilicate glass (PSG) 902 is deposited. In one embodiment, the conformal PSG layer 902 may be deposited by Atomic Layer Deposition (ALD). Those skilled in the art will appreciate that the thickness of the PSG layer 902 may vary substantially without departing from the spirit of scope of the instant invention. For example, it is envisioned that the thickness of the PSG layer 902 may vary in the range of about 0.5 nm to about 6 nm, with a preferred range of about 1 nm to about 4 nm.

Figure 10:
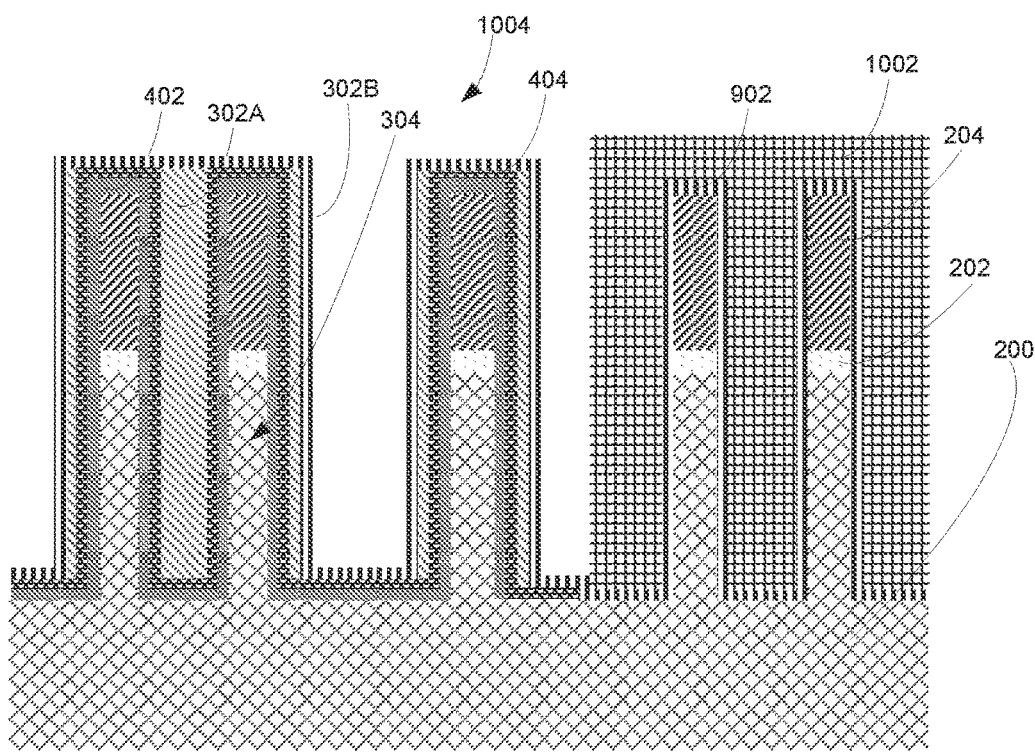

Turning now to FIG. 10, a lithographic process is illustrated to protect the PSG layer 902 in selected regions and allow removal of the PSG layer 902 in other regions. Those skilled in the art will appreciate that, generally, the PSG layer 902 will be removed from those areas overlying the BSG layer 702, and retained in at least a portion of those areas that do not have an underlying BSG layer 702 so as to produce both Nwell and Pwell regions on the wafer 200.

Using conventional techniques, a mask 1002 is formed over select regions of the wafer 200, leaving the region 1004 exposed for subsequent etching steps. In some embodiments, it may be useful to utilize a planarizing layer and/or bottom antireflection coating (BARC), as is known by those skilled in the art.

Figure 11:
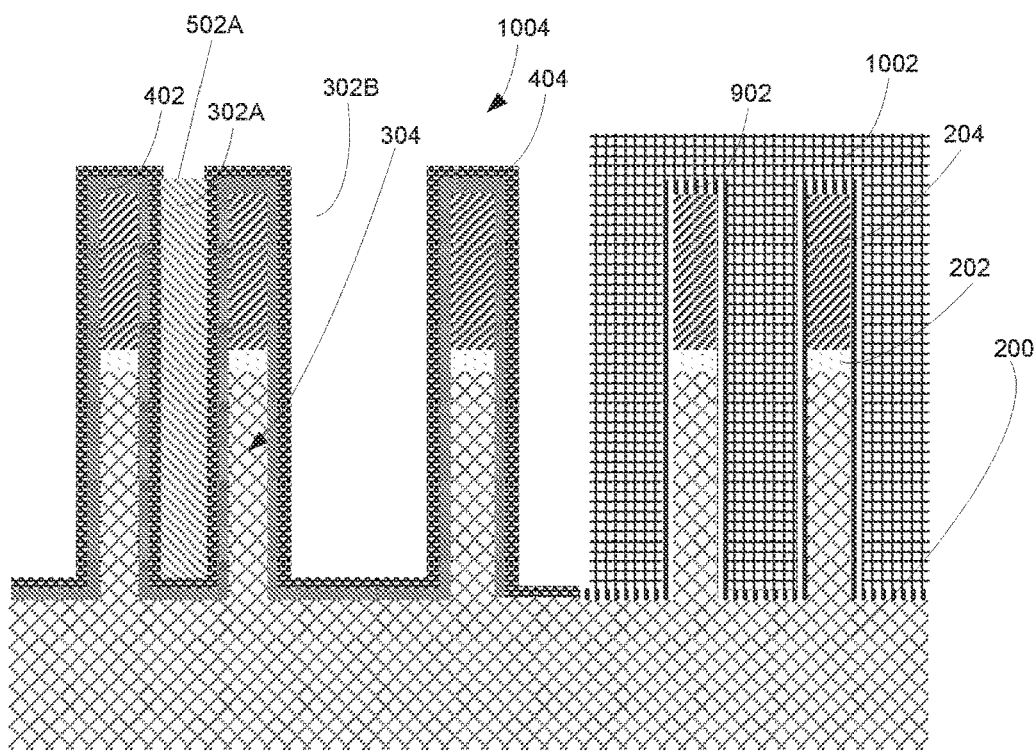

Referring now to FIG. 11, a conventional etch process has been employed to remove the PSG layer 902 from those area unprotected by the mask 1002. As those skilled in the art will readily appreciate, the etch process may be configured such that a substantial portion of the conformal oxide layer 502 is also removed, which may result in the conformal oxide layer 502A located in the narrow recess 302A being partially or entirely removed.

Figure 12A:
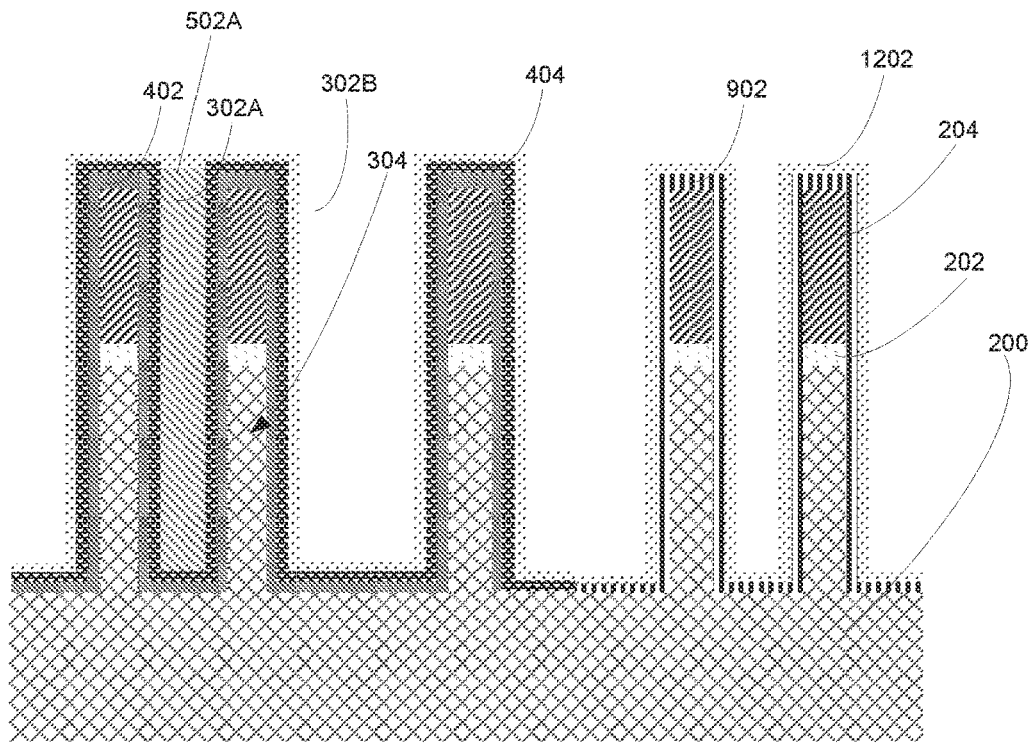

Thereafter, as shown in FIG. 12A, the mask 1002 may be removed using conventional techniques, and then a layer of second nitride 1202 is deposited over the PSG layer 902 and the first nitride layer 404. Those skilled in the art will appreciate that the thickness of the second nitride layer 1202 may vary substantially without departing from the spirit of scope of the instant invention. For example, it is envisioned that the thickness of the second conformal nitride layer 1202 may vary in the range of about 1 nm to about 6 nm, with a preferred range of about 1.5 nm to about 4 nm.

Figure 12B:
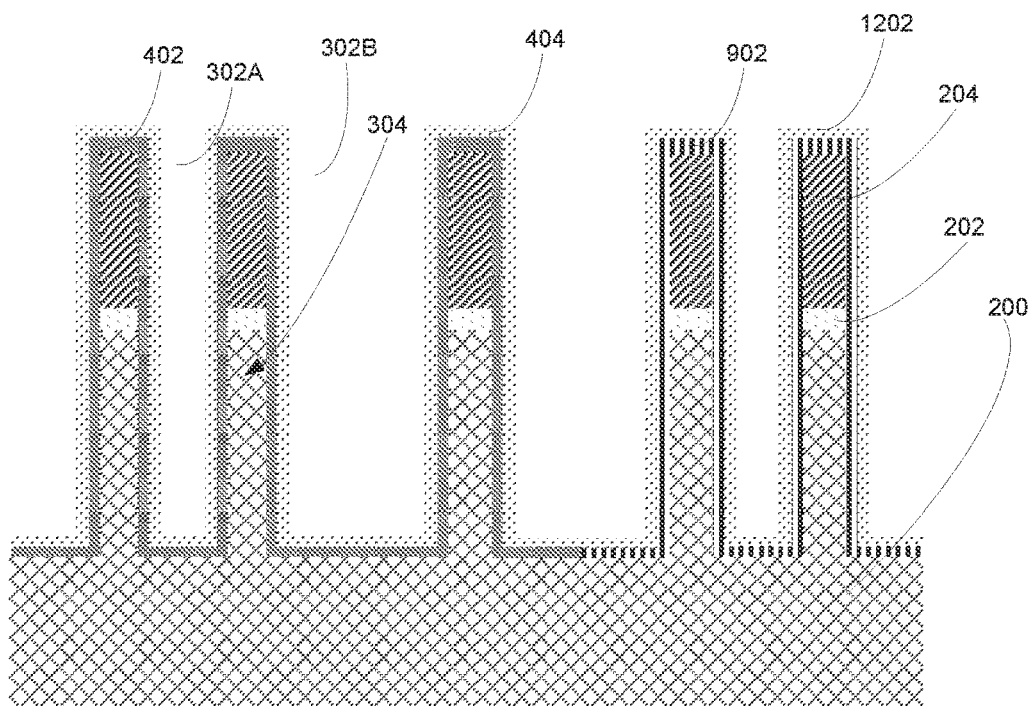

FIG. 12B illustrates an alternative embodiment in which the conformal oxide layer 502 has been completely removed (even from the narrow recess 302A), as well as the first nitride layer 404. In this embodiment, the second nitride layer 1202 is positioned directly over the BSG layer 402 and the PSG layer 902, even within the narrow recess 302A. This results in a structure where the nMOS region, which has the BSG layer 402, and the pMOS region, which has the PSG layer 1202, both have a single doped oxide layer 402 (nMOS) or 902 (pMOS) and a single nitride 1202.

Figure 13:
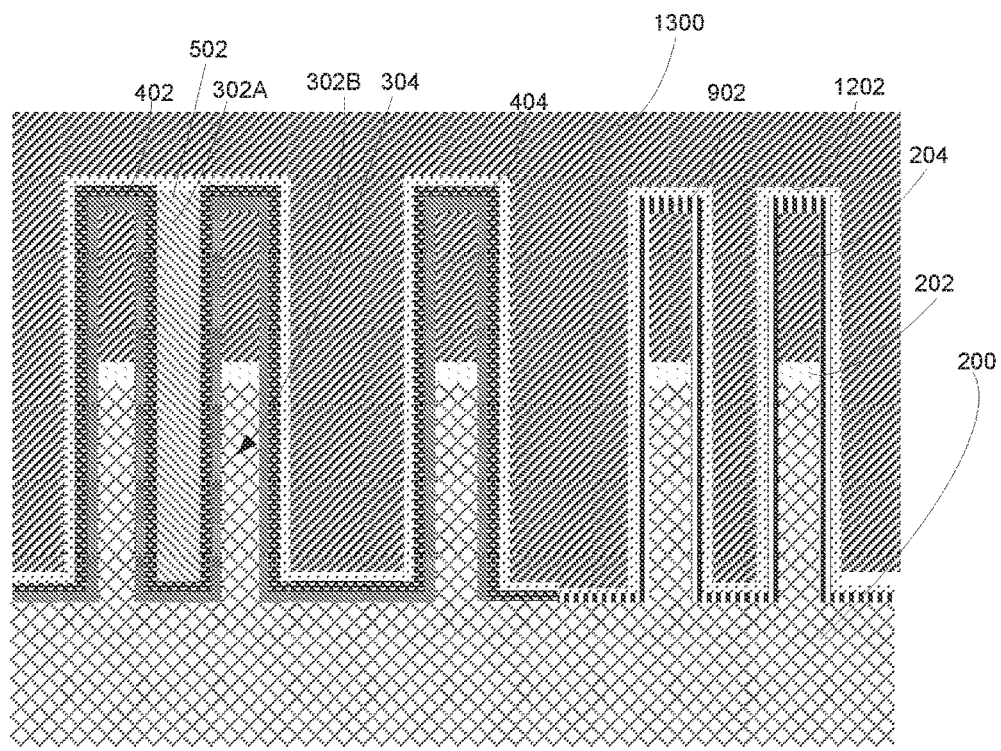

Turning now to FIG. 13, it may be useful to implement a Shallow Trench Isolation (STI) process and, at least partially, fill the recesses 302 with an STI dielectric 1300. As illustrated, the embodiment shown in FIG. 13 includes the conformal oxide layer 502 within the narrow recess 302A. However, those skilled in the art will appreciate that in instances where the conformal oxide layer 502 has been entirely removed, such as is illustrated in FIG. 12B, then the STI dielectric 1300 will also be deposited within the narrow recess 302A.

Hereafter, conventional fin reveal, gate formation, junction formation, contact formation, metallization, and the like may proceed using well-known processes. For example, after the STI dielectric 1300 layer is deposited, a chemical-mechanical polishing (CMP) process may be performed to produce the structure show in FIG. 14A by ending the CMP process upon detecting nitride.

Figure 14A:
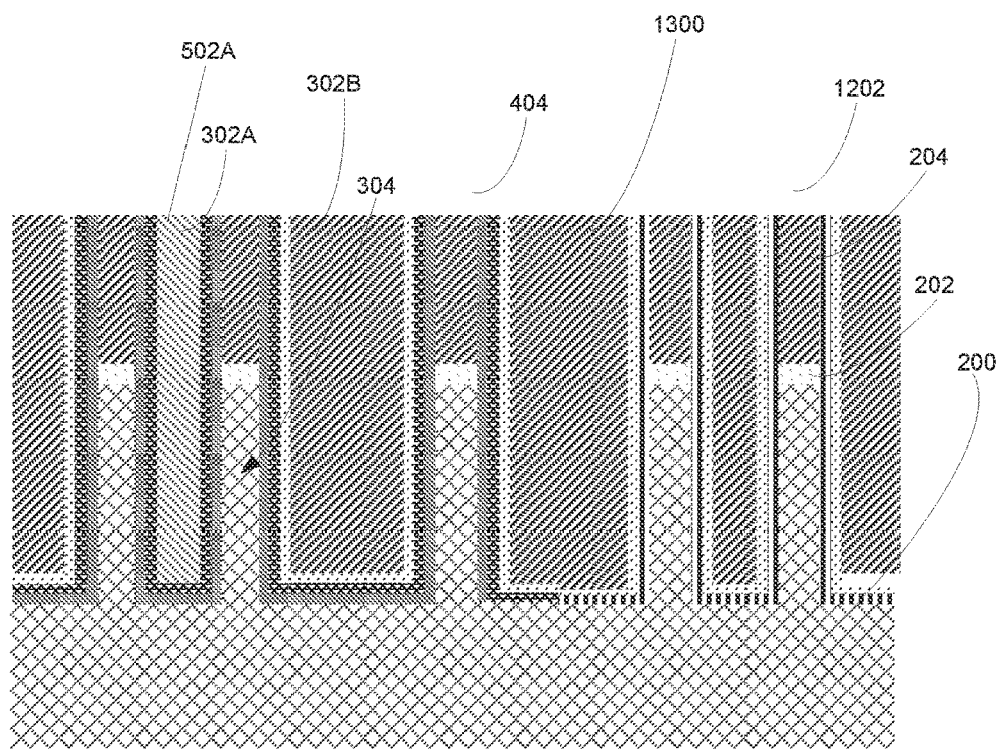
Figure 14B:
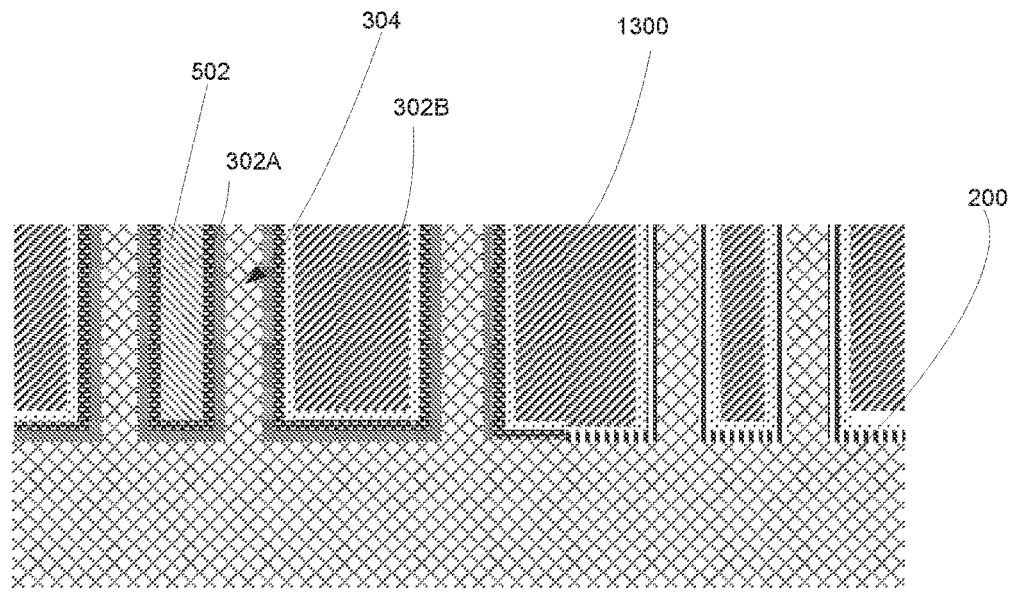

Alternatively, as shown in FIG. 14B, the CMP process may be allowed to continue through the nitride layer 204 and the oxide layer 202 and expose the top portion of fins 304 of the wafer 200.

Figure 15:
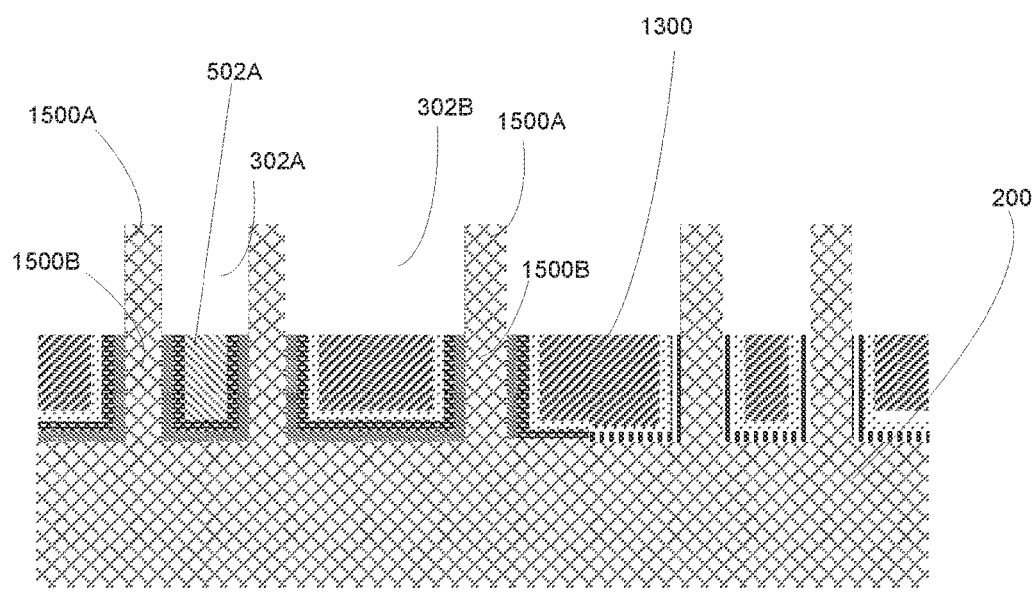

As illustrated in FIG. 15, an etching process may be performed to reveal a portion of the fins 1500A, by etching the STI dielectric 1300, the first nitride layer 404, the BSG layer 402, the conformal oxide layer 502, the second nitride layer 1202, and the PSG layer 902. One or more conventional etching steps may be utilized to remove the STI dielectric 1300, the first nitride layer 404, the BSG layer 402, the conformal oxide layer 502, the second nitride layer 1202, and the PSG layer 902 to provide substantially uniform heights for the revealed portion of fins 1500A.

Thereafter, dopant from the BSG and PSG layers 402, 902 may be driven into the wafer 200 and unrevealed portions of the fins 1500B utilizing conventional semiconductor processing techniques. Additionally, a conventional gate formation process may be performed to produce a gate (not shown). These processes are readily known to those of ordinary skill in the art, and thus, are not discussed in greater detail herein to avoid unnecessarily obfuscating the invention. Additionally, while the figures indicate abrupt locations of dopants, in practice there will be some mixing as a result of effects like diffusion and implant straggle in the final structure.

Figure 16:
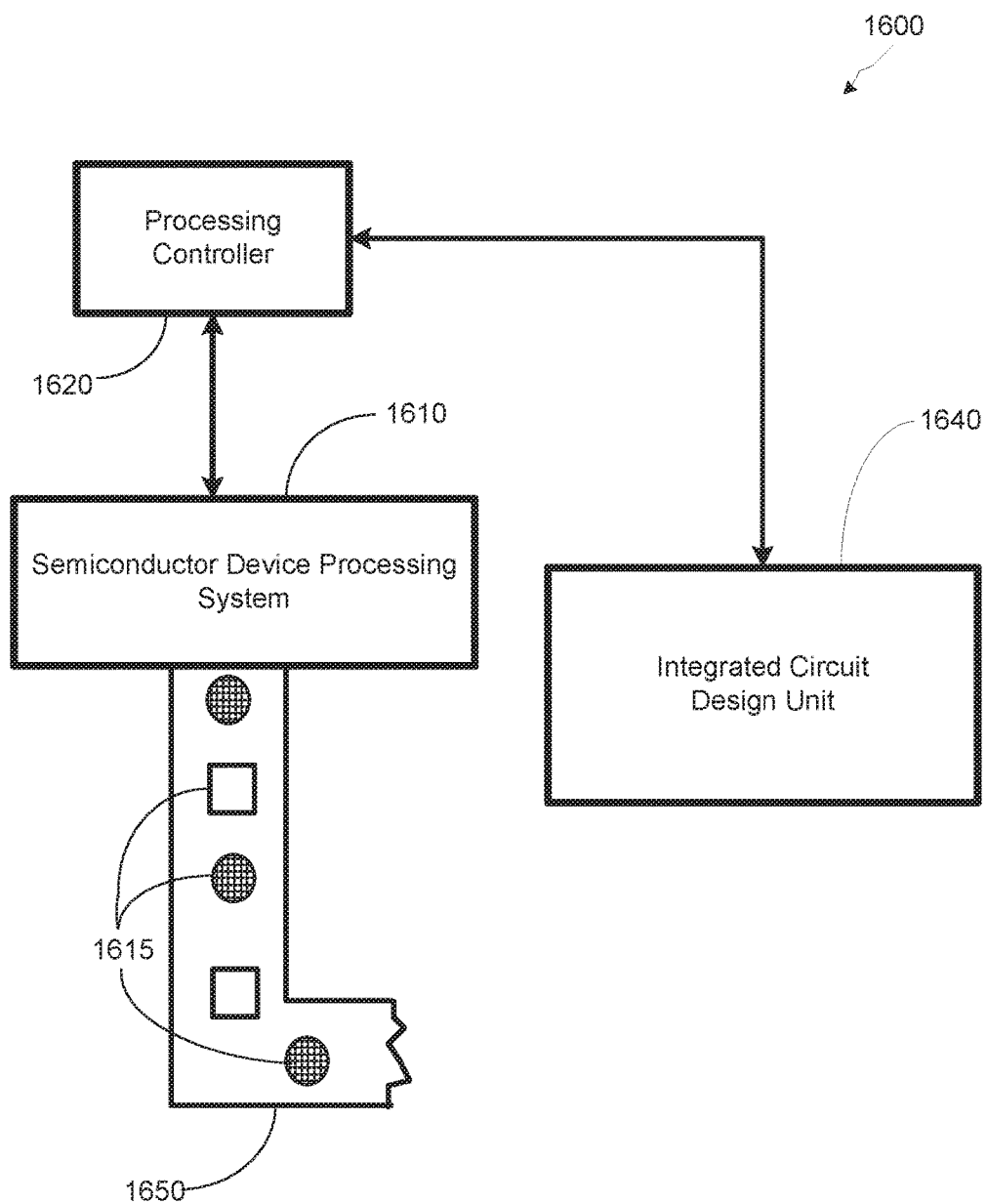
FIG. 16 illustrates a stylized depiction of a system for fabricating a semiconductor device comprising a finFET device having both tight and relaxed fin pitches.

Turning now to FIG. 16, a stylized depiction of a system for fabricating a semiconductor device comprising a finFET device having fins with relatively narrow and relatively wide pitches, in accordance with embodiments herein, is illustrated. The system 1600 is capable of manufacturing semiconductor devices using the process steps described above. The system 1600 of FIG. 16 may comprise a semiconductor device processing system 1610 and a design unit 1640. The semiconductor device processing system 1610 may manufacture integrated circuit devices based upon one or more designs provided by the design unit 1640.

The semiconductor device processing system 1610 may comprise various processing stations, such as etch process stations, photolithography process stations, CMP process stations, etc. One or more of the processing steps performed by the processing system 1610 may be controlled by the processing controller 1620. The processing controller 1620 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1610 may produce integrated circuits on a medium, such as silicon wafers. The production of integrated circuits by the device processing system 1610 may be based upon the circuit designs provided by the integrated circuits design unit 1640. The processing system 1610 may provide processed integrated circuits/devices 1615 on a transport mechanism 1650, such as a conveyor system. In some embodiments, the conveyor system may be sophisticated clean room transport systems that are capable of transporting semiconductor wafers. In one embodiment, the semiconductor device processing system 1610 may comprise a plurality of processing steps, e.g., the $1^{st}$ process step, the $2^{nd}$ process set, etc., as described above.

In some embodiments, the items labeled "1615" may represent individual wafers, and in other embodiments, the items 1615 may represent a group of semiconductor wafers, e.g., a "lot" of semiconductor wafers. The integrated circuit or device 1615 may be a transistor, a capacitor, a resistor, a memory cell, a processor, and/or the like. In one embodiment, the device 1615 includes a plurality of transistors.

The integrated circuit design unit 1640 of the system 1600 is capable of providing a circuit design that may be manufactured by the semiconductor processing system 1610. The design unit 1640 may receive data relating to the functional cells to utilize, as well as the design specifications for the integrated circuits to be designed. In one embodiment, the integrated circuit design unit 1640 may comprise finFETs having both Si and SiGe fins.

The system 1600 may be capable of performing analysis and manufacturing of various products involving various technologies. For example, the system 1600 may use design and production data for manufacturing devices of CMOS technology, Flash technology, BiCMOS technology, power devices, memory devices (e.g., DRAM devices), NAND memory devices, and/or various other semiconductor technologies.

The methods described above may be governed by instructions that are stored in a non-transitory computer readable storage medium and that are executed by, e.g., a processor in a computing device. Each of the operations described herein may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed is:

1. A method for forming a finFET device, comprising:
   forming a plurality of recesses in a semiconductor wafer to form a plurality of fins therebetween, a first portion of the recesses being relatively narrower than a second portion of the recesses;
   forming a first layer of doped silicate glass above the semiconductor wafer and within the plurality of recesses;
   forming a first layer of nitride above the first doped silicate glass layer;
   forming a conformal oxide layer above the first nitride layer, substantially filling the first portion of relatively narrower recesses and lining the second portion of recesses;
   removing the conformal oxide layer from a top surface of the plurality of the fins;
   removing the first doped silicate glass layer, the first nitride layer, and the conformal oxide layer adjacent a first portion of the plurality of fins and recesses;
   forming a second layer of doped silicate glass having an opposite doping polarity to the first doped silicate glass above the wafer;
   removing the second layer of doped silicate glass layer and at least a portion of the conformal oxide layer from above the first doped silicate glass layer, wherein the removing comprises forming a second mask above at least a portion of the plurality of fins and recesses free from the first doped silicate glass layer; and removing the second doped silicate glass layer and the conformal oxide layer from the plurality of fins and recesses free of the second mask;
   forming a second layer of nitride above the semiconductor wafer;
   performing a shallow trench isolation process to at least partially fill the plurality of recesses; and
   removing a portion of the material in the plurality of recesses to reveal the plurality of fins.

2. A method, as set forth in claim 1, wherein removing the first doped silicate glass layer, the first nitride layer, and the conformal oxide layer adjacent the first portion of the plurality of fins and recesses further comprises:
   forming a first mask over a second portion of the plurality of fins and recesses;
   removing the first doped silicate glass layer, the first nitride layer, and the conformal oxide layer from the plurality of fins and recesses free of the first mask.

3. A method, as set forth in claim 1, further comprising:
   removing the first nitride layer from above the first doped silicate glass layer.

4. A method, as set forth in claim 1, wherein forming the first layer of doped silicate glass above the semiconductor wafer and within the plurality of recesses further comprises forming the first layer of doped silicate glass having a thickness in the range of about 0.5 nm to about 6 nm.

5. A method, as set forth in claim 1, wherein forming the first layer of nitride above the first doped silicate glass layer further comprises forming the first layer of nitride having a thickness in the range of about 1 nm to about 6 nm.

6. A method, as set forth in claim 1, wherein forming the layer of conformal oxide above the first layer of nitride further comprises forming the first layer of conformal oxide having a thickness in the range of about 2 nm to about 15 nm.

7. A method, as set forth in claim 1, wherein forming the second layer of doped silicate glass above the semiconductor wafer further comprises forming the second layer of doped silicate having a thickness in the range of about 0.5 nm to about 6 nm.

8. A method, as set forth in claim 1, wherein forming the second layer of nitride above the semiconductor wafer further comprises forming the second layer of nitride having a thickness in the range of about 1 nm to about 6 nm.

9. A method, as set forth in claim 1, wherein the first doped silicate glass layer is comprised of borosilicate glass (BSG), and the second doped silicate glass layer is comprised of phosphosilicate glass (PSG).

10. A method, as set forth in claim 1, wherein the first doped silicate glass layer is comprised of phosphosilicate glass (PSG), and the second doped silicate glass layer is comprised of borosilicate glass (BSG).

11. A method for forming a finFET device, comprising:
    forming a plurality of recesses in a semiconductor wafer to form a plurality of fins therebetween;
    forming a first layer of doped silicate glass above the semiconductor wafer and within the plurality of recesses;

forming a first layer of nitride above the first doped silicate glass layer;

forming an oxide layer above the nitride layer, substantially filling a first portion of the plurality of recesses and forming a layer of oxide on sidewall and bottom surfaces of a second portion of the recesses;

removing the oxide layer from a top surface of the plurality of the fins and the bottom surface of the second portion of the recesses;

forming a first mask over a portion of the plurality of fins and recesses;

removing the first doped silicate glass layer, the nitride layer, and the oxide layer from the plurality of fins and recesses free of the first mask;

removing the first mask;

forming a second layer of doped silicate glass above the wafer;

forming a second mask above at least a portion of the plurality of fins and recesses free from the first doped silicate glass layer;

removing the second doped silicate glass layer and at least a portion of the oxide layer from the plurality of fins and recesses free of the second mask;

removing the second mask;

forming a second layer of nitride above the semiconductor wafer;

performing a shallow trench isolation process to at least partially fill the plurality of recesses; and removing a portion of the material in the plurality of recesses to reveal the plurality of fins.

12. A method, as set forth in claim 11, wherein forming the first doped silicate glass layer above the semiconductor wafer and within the plurality of recesses further comprises forming the first layer of doped silicate glass having a thickness in the range of about 0.5 nm to about 6 nm.

13. A method, as set forth in claim 11, wherein forming the first layer of nitride above the first doped silicate glass layer further comprises forming the first layer of nitride having a thickness in the range of about 1 nm to about 6 nm.

14. A method, as set forth in claim 11, wherein forming the layer of oxide above the first layer of nitride further comprises forming the first layer of nitride having a thickness in the range of about 2 nm to about 15 nm.

15. A method, as set forth in claim 11, wherein forming the second layer of doped silicate glass above the semiconductor wafer further comprises forming the layer of PSG having a thickness in the range of about 0.5 nm to about 6 nm.

16. A method, as set forth in claim 11, wherein forming the second layer of nitride above the semiconductor wafer further comprises forming the second layer of nitride having a thickness in the range of about 1 nm to about 6 nm.

17. A method, as set forth in claim 11, wherein removing the second doped silicate glass layer and at least a portion of the oxide layer from the plurality of fins and recesses free of the second mask further comprises removing substantially all of the oxide layer from the plurality of fins and recesses free of the second mask.

18. A method, as set forth in claim 11, wherein the first doped silicate glass layer is comprised of borosilicate glass (BSG), and the second doped silicate glass layer is comprised of phosphosilicate glass (PSG).

19. A method, as set forth in claim 11, wherein the first doped silicate glass layer is comprised of phosphosilicate glass (PSG), and the second doped silicate glass layer is comprised of borosilicate glass (BSG).

* * * * *